(12) United States Patent
Steinfeld et al.

(10) Patent No.: US 12,417,893 B2
(45) Date of Patent: Sep. 16, 2025

(54) DIFFRACTOMETER FOR CHARGED-PARTICLE CRYSTALLOGRAPHY

(71) Applicant: ELDICO SCIENTIFIC AG, Allschwil (CH)

(72) Inventors: Gunther Steinfeld, Waedenswil (CH); Gustavo Santiso-Quinones, Albbruck-Birkingen (DE); Eric Hovestreydt, Karlsruhe (DE)

(73) Assignee: ELDICO SCIENTIFIC AG, Allschwil (CH)

( * ) Notice: Subject to any disclaimer, the term of this patent is extended or adjusted under 35 U.S.C. 154(b) by 450 days.

(21) Appl. No.: 17/611,424

(22) PCT Filed: May 19, 2020

(86) PCT No.: PCT/EP2020/063953
§ 371 (c)(1),
(2) Date: Nov. 15, 2021

(87) PCT Pub. No.: WO2020/234291
PCT Pub. Date: Nov. 26, 2020

(65) Prior Publication Data
US 2022/0238299 A1   Jul. 28, 2022

(30) Foreign Application Priority Data
May 20, 2019   (EP) ..................................... 19175432

(51) Int. Cl.
*H01J 37/20*   (2006.01)
*G01N 23/207*   (2018.01)
*H01J 37/26*   (2006.01)

(52) U.S. Cl.
CPC .......... *H01J 37/20* (2013.01); *G01N 23/2076* (2013.01); *H01J 2237/20207* (2013.01);
(Continued)

(58) Field of Classification Search
None
See application file for complete search history.

(56) References Cited

U.S. PATENT DOCUMENTS

| | | |
|---|---|---|
| 4,950,901 A | 8/1990 | Jones et al. |
| 5,525,806 A | 6/1996 | Iwasaki et al. |

(Continued)

FOREIGN PATENT DOCUMENTS

| | | |
|---|---|---|
| CN | 101436506 A | 5/2009 |
| CN | 102446683 A | 5/2012 |

(Continued)

OTHER PUBLICATIONS

Office Action issued in Japanese Patent Application No. 2021-569073 (Nov. 22, 2022), 15 pages.

(Continued)

*Primary Examiner* — Eliza W Osenbaugh-Stewart
(74) *Attorney, Agent, or Firm* — Merchant & Gould P.C.

(57) ABSTRACT

The present invention relates to a diffractometer for charged-particle crystallography of a crystalline sample, in particular for electron crystallography of a crystalline sample. The diffractometer comprises a charged-particle source for generating a charged-particle beam along a charged-particle beam axis, a charged-particle-optical system for manipulating the charged-particle beam such as to irradiate the sample with the charged-particle beam and a charged-particle detection system at least for collecting a diffraction pattern of the sample based on the beam of charged-particles transmitted through the sample. The diffractometer further comprises a sample holder for holding the sample and a manipulator operatively coupled to the sample holder for positioning the sample relative to the beam axis. The manipulator comprises a rotation stage for tilting the sample holder with respect to the incident charged-particle beam around a tilt axis, and a multi-axes translation stage for moving the sample holder at (Continued)

least in a plane perpendicular to the tilt axis. The multi-axes translation stage is operatively coupled between the sample holder and the rotation stage such that the multi-axes translation stage is in a rotational system of the rotation stage and the sample holder is in a moving system of the multi-axes translation stage.

22 Claims, 3 Drawing Sheets

(52) U.S. Cl.
CPC ............... *H01J 2237/20221* (2013.01); *H01J 2237/20242* (2013.01)

(56) References Cited

U.S. PATENT DOCUMENTS

| | | | |
|---|---|---|---|
| 5,753,924 | A | 5/1998 | Swann |
| 7,297,965 | B2 | 11/2007 | Kidron et al. |
| 7,335,882 | B1 | 2/2008 | Brown, Jr. et al. |
| 9,391,146 | B2 | 7/2016 | Yamazaki et al. |
| 9,697,983 | B1 | 7/2017 | Lanio et al. |
| 9,799,485 | B2 | 10/2017 | Mueller et al. |
| 9,978,557 | B2 | 5/2018 | Flanagan, IV |
| 10,152,785 | B2 | 12/2018 | Kingston et al. |
| 2011/0175629 | A1* | 7/2011 | Duden ................ G11B 7/0925 324/658 |
| 2011/0220796 | A1 | 9/2011 | Nicolopoulos et al. |
| 2011/0253905 | A1 | 10/2011 | Moebus et al. |
| 2012/0001068 | A1* | 1/2012 | He .................. G01N 23/20058 250/307 |
| 2015/0008321 | A1 | 1/2015 | Ohgarane et al. |
| 2016/0181059 | A1 | 6/2016 | Vystavel et al. |
| 2020/0135424 | A1* | 4/2020 | Durst .................... H01J 37/295 |

FOREIGN PATENT DOCUMENTS

| | | |
|---|---|---|
| CN | 103311081 A | 9/2013 |
| CN | 103779160 A | 5/2014 |
| CN | 105789004 A | 7/2016 |
| CN | 105910855 A | 8/2016 |
| CN | 106653538 A | 5/2017 |
| CN | 107437488 A | 12/2017 |
| CN | 107966464 A | 4/2018 |
| CN | 108155078 A | 6/2018 |
| CN | 108666193 A | 10/2018 |
| EP | 2402976 A1 | 1/2012 |
| EP | 2613338 A2 | 7/2013 |
| EP | 2642279 A1 | 9/2013 |
| EP | 2811288 A1 | 12/2014 |
| EP | 2908235 | 8/2015 |
| EP | 3246934 A1 | 11/2017 |
| EP | 3379236 A1 | 9/2018 |
| EP | 3379557 A1 | 9/2018 |
| EP | 3078054 B1 | 10/2018 |
| EP | 3392900 A1 | 10/2018 |
| FR | 2908235 A1 | 5/2008 |
| JP | S53-132258 U | 10/1978 |
| JP | S60-085056 U | 6/1985 |
| JP | H02-168547 A | 6/1990 |
| JP | H07-012763 A | 1/1995 |
| JP | H08-106873 A | 4/1996 |
| JP | 2006-127805 A | 5/2006 |
| JP | 2009-152120 A | 7/2009 |
| JP | 2011-514641 A | 5/2011 |
| JP | 2012-013703 A | 1/2012 |
| JP | 2017-204375 A | 11/2017 |
| JP | 2018-129163 A | 8/2018 |
| NL | 2011876 C2 | 6/2015 |
| WO | 00/10191 A1 | 2/2000 |
| WO | 00/52731 A2 | 9/2000 |
| WO | 2005/022582 A1 | 3/2005 |
| WO | 2008/060237 A1 | 5/2008 |
| WO | 2011/033097 A | 3/2011 |
| WO | 2012/155044 A1 | 11/2012 |
| WO | 2017/068030 A1 | 4/2017 |

OTHER PUBLICATIONS

Office Action for Chinese Patent Application No. 202080037920.4 (Jun. 16, 2023).
J. Kolb et al., "Towards automated diffraction tomography. Part II—Cell parameter determination", Ultramicroscopy 108: 763-772 (2008).
R. Dronyak et al., "Electron coherent diffraction tomography of a nanocrystal", Applied Physics Letters 96: 221907 (2010).
G.A. Schwind et al., "Comparison of parameters for Schottky and cold field emission sources", J. Vac. Sci. Technol. B 24(6): 2897-2901 (2006).
J. Kolb et al., "Towards automated diffraction tomography: Part I—Data acquisition", Ultramicroscopy 107: 507-513 (2007).
D. Shi et al., "Three-dimensional electron cystallography of protein microcrystals", eLife 2:e01345 Biochemistry, Biophysics and structural biology: 1-17 (2013).
M.G. Iadanza et al., "A suite of software for processing MicroED data of extremely small protein crystals", J. Appl. Cryst. 47: 1140-1145 (2014).
B.L. Nannenga et al., "High-resolution structure determination by continuous-rotation data collection in MicroED", Nature Methods 11(9): 927-931 (2014).
B.L. Nannenga et al., "Protein structure detemination by MicroED", Current Opinion in Structural Biology 27: 24-31 (2014).
B.L. Nannenga et al., "MicroED opens a new era for biological structure determination", Current Opinion in Structural Biology 40: 128-135 (2016).
B.L. Nannenga et al., "Structure of catalase determined by MicroED", eLife 3:e03600, Biochemistry, Biophysics and structural biology: 1-11 (2014).
M.R. Sawaya et al., "Ab initio structure determination from prion nanocrystals at atomic resolution by MicroED", PNAS 113(40): 11232-11236 (2016).
M.J. De La Cruz et al., "Atomic-resolution structures from fragmented protein crystals with the cryoEM method MicroED", Nature Methods 14(4): 399-415 (2017).
T. Gruene et al., "Rapid Structure Determination of Microcrystalline Molecular Compounds Using Electron Diffraction", Angew. Chem. Int. Ed. 57: 16313-16317 (2018).
C.G. Jones et al., "The CryoEM Method MicroED as a Powerful Tool for Small Molecule Structure Determination", ACS Cent. Sci. 4: 1587-1592 (2018).
J.A. Rodriguez et al., "Structure of the toxic core of α-synuclein from invisible crystals", Article, Nature 000: 1-15 (2015).
M.F. Hayles, Akashi Seisakusho Ltd—SEM Development 1972-1986, Biological Field Emission Scanning Electron Microscopy, First Edition: 7-23 (2019).
International Search Report and Written Opinion for PCT/EP2020/063953 (Jul. 15, 2020).
Notice of Allowance for Korean Patent Application No. 10-2021-7037127 (Aug. 10, 2024), 2 pages.

* cited by examiner

DIFFRACTOMETER FOR CHARGED-PARTICLE CRYSTALLOGRAPHY

This application is a US National Stage application of PCT International patent application No. PCT/EP2020/063953, filed May 19, 2020, which claims the benefit of priority to European Patent Application No. 19175432.4, filed May 20, 2019, which applications are incorporated herein by reference. To the extent appropriate, a claim of priority is made to each of the above disclosed applications.

FIELD OF THE INVENTION

The present invention relates to a diffractometer for charged-particle crystallography of a crystalline sample, in particular for electron crystallography of a crystalline sample.

BACKGROUND OF THE INVENTION

Crystallography is an essential technology in most fields of chemistry, in particular for structure determination of crystalline samples. For many decades, X-ray diffraction analysis has been the main technology for structure determination. However, X-ray diffraction analysis requires large and well-ordered crystals to withstand the negative effects of radiation damage during irradiation and data collection. For analyzing smaller samples, in particular those which are difficult to be grown to a sufficiently large size, it has been proposed to use charged-particles, such as electrons, for structure determination. In contrast to X-ray diffraction, charged-particle diffraction imposes virtually no lower size limit to the crystal. For example, using a beam of accelerated electrons allows for recording diffraction patterns of nano-crystalline samples having a diameter of less than one micrometer down to several nanometers.

Typically, electron diffraction analysis is performed in standard electron microscopes, in particular Transmission Electron Microscopes (TEM). For this, the crystalline sample is mounted to a sample holder within the sample chamber of the microscope. An electron source of the microscope generates a beam of energetic electrons which subsequently is manipulated (deflected and/or focused) by electron-optical elements (electron lenses, deflectors, and/or multi-poles) such as to irradiate the sample mounted to the sample holder with the electron beam. The sample holder may allow for positioning the sample relative to the beam axis at least along three translational degrees of freedom and one rotational degree of freedom. The rotational degree of freedom is used to tilt the sample holder around a tilt axis with respect to the incident electron beam, thus allowing to acquire a tilt series of diffraction patterns by irradiating the sample at different tilt angles and collecting for each tilt position the electrons transmitted through the sample using an electron imaging system. Finally, the images of the tilt series are aligned with respect to each other in order to reconstruct a three-dimensional electron diffraction data set of the crystalline sample. This procedure is often denoted as electron diffraction tomography and described, for example, in EP 2 402 976 A1 or in Shi et al., eLife 2013, e01345, DOI: 10.7554/eLife.01345.

Due to the small beam size and due to the small sample sizes, the volume-of-interest, that is, the sample volume may be removed from the beam axis when changing the tilt angle to another position. This displacement may in particular occur in case the sample is arranged off-center with regard to the tilt axis. Accordingly, repositioning of the sample in a plane perpendicular to the tilt axis may be required for each image of the tilt series. However, this procedure may be laborious and time-consuming, if possible at all.

Therefore, it is an object of the present invention to provide a diffractometer for charged-particle crystallography with the advantages of prior art solutions but without their limitations. In particular, it is an object of the present invention to provide a diffractometer for charged-particle crystallography which allows for a more stable positioning of the sample with regard to the charged-particle beam, in particular which requires less repositioning of the sample relative to the charged-particle beam.

DESCRIPTION OF THE INVENTION

These and other objects are met by a diffractometer for charged-particle crystallography of a crystalline sample as specified in the independent claim. Advantageous embodiments of the diffractometer according to the invention are the subject of the dependent claims.

According to the invention there is provided a diffractometer for charged-particle crystallography of a crystalline sample, in particular for electron crystallography of a crystalline sample, wherein the diffractometer comprises:
- a charged-particle source for generating a charged-particle beam along a charged-particle beam axis;
- a charged-particle-optical system for manipulating the charged-particle beam such as to irradiate the sample with the charged-particle beam;
- a sample holder for holding the sample;
- a manipulator operatively coupled to the sample holder for positioning the sample relative to the beam axis, wherein the manipulator comprises a rotation stage for tilting the sample holder with respect to the incident charged-particle beam around a tilt axis, and a multi-axes translation stage for moving the sample holder at least in a plane perpendicular to the tilt axis; and
- a charged-particle detection system at least for collecting a diffraction pattern of the sample based on the beam of charged-particles transmitted through the sample.

According to the invention, the multi-axes translation stage is operatively coupled between the sample holder and the rotation stage such that the multi-axes translation stage is in a rotational system of the rotation stage and the sample holder is in a moving system of the multi-axes translation stage.

Advantageously, having the multi-axes translation stage operatively coupled between the sample holder and the rotation stage enables to exactly position the sample, that is, its center of mass, on-axis with regard to the tilt axis. Accordingly, due to the on-axis position, the sample does not revolve in a circle around the tilt axis when changing the tilt angle. Instead, the translational position of the center of mass of the sample is substantially stable within a plane perpendicular to the tilt axis. Thus, once the charged-particle beam is focused onto the on-axis position of the sample, the volume-of-interest, that is, the sample volume substantially stays within the charged-particle beam for each tilt angle position. For this reason, the center of mass of the sample advantageously needs to be aligned to the tilt axis only once prior to taking diffraction patterns for different tilt angle. Thus, re-alignment of the sample each time the tilt angle is changed is not necessary any longer.

Preferably, the manipulator, in particular the multi-axes translational stage, is configured such as to allow a positioning accuracy of the center of mass of the sample relative to the tilt axis with a maximum lateral deviation from the tilt axis of at most 1 µm, in particular of at most 0.5 µm, preferably of at most 0.3 µm, even more preferably of at most 0.1 µm. Moreover, as will be described also further below, the diffractometer may comprise a feedback controller which is operatively coupled to the manipulator and a measurement device for measuring a position of the sample holder. The feedback controller may be configured to control the position of the sample relative to the charged-particle beam. In particular, the feedback controller in combination with the manipulator, in particular the multi-axes translational stage, and with the measurement device may be configured to control the position of the sample relative to the charged-particle beam such that for each tilt angle position the center of mass of the sample stays substantially on-axis with regard to the tilt axis with a maximum lateral deviation from the tilt axis of at most 1 µm, in particular of at most 0.5 µm, preferably of at most 0.3 µm, even more preferably of at most 0.1 µm.

As used herein, the term "rotational system of the rotation stage" refers to the moving part of the rotation stage which is rotatable relative to the quasi-stationary part of the rotation stage. The latter preferably is rotationally stationary to a stationary reference system of the diffractometer, that is, relative to the location of the diffraction, for example to the laboratory. Likewise, the term "moving system of the multi-axes translation stage" refers to the moving part of the multi-axes translation stage which is translationally movable relative to a quasi-stationary part of the multi-axes translation stage. The quasi-stationary part of the multi-axes translation stage is translationally stationary relative to a reference system with respect to the translational degrees of freedom of the multi-axes translation stage. In the present case, the quasi-stationary part of the multi-axes translation stage is translationally stationary relative to the rotational system of the rotation stage as well as to the stationary reference system of the diffractometer, at least concerning the translational degrees of freedom of the multi-axes translation stage.

Preferably, the charged-particle source is an electron source for generating an electron beam along the charged-particle beam axis. As compared to x-ray diffraction, the interaction between electrons and the atoms of the crystalline sample is much larger, allowing to observe diffraction patterns of crystals having a diameter of the less than one micrometer down to several nanometers. In addition, when using electrons, the diffractometer according to the present invention may advantageously implement components and techniques that are well known from electron microscopy, in particular from TEMs. This applies to the charged-particle source as well as to the charged-particle optical system and the charged-particle-optical imaging system. The latter will be described in more detail further below.

Preferably, the electron source is configured to generate an electron beam having an energy in a range of 60 keV to 300 keV, with a tolerance in a range of ±0.7 keV to ±1.5 keV or in range of ±7 eV to ±150 eV. For example, the electron source may be configured to generate an electron beam of 200 keV±1.2 keV. Preferably, the electron source may be configured to generate an electron beam of 160 keV having a ripple of at most 80 eV peak-to peak, in particular of at most 10 eV, more particularly of at most 5 eV. The electron source may be configured to be operated at one or more constant acceleration voltages. Alternatively, the electron source may be configured to generate a beam of electrons having a selectable energy.

Advantageously, the charged-particle-optical system may be configured to manipulate the charged-particle beam such the charged-particle beam irradiated to the sample is a parallel beam of charged-particles having a beam diameter of at most 1.5 µm, in particular of at most 1 µm, preferably at most 0.3 µm, for example, in a range between 0.5 µm and 0.3 µm or in a range between 0.3 µm and 0.15 µm. Preferably, the beam diameter is adapted to the volume of the sample.

Preferably, the charged-particle-optical system may comprise one or more condenser lenses to form the charged-particle beam on the sample. In addition, the charged-particle-optical system may comprise an aperture upstream of the sample to adapt the diameter of the charged-particle beam at the sample position. The charged-particle-optical system may further comprise one or more alignment coils or deflectors, in particular double deflectors or octopole deflectors, to center the charged-particle beam on the beam axis. For example, the charged-particle-optical system may further comprise two double deflectors and three condenser lenses.

Preferably, the detection system may comprise an objective lens to form a magnified image of the sample. The detection system may further comprise a projection system, which for example may include two lenses, to form a magnified image of the sample on a detector. The detector may be a fluorescent screen or an electron detector. For example, the detector may be a two-dimensional hybrid pixel detector. As will be described in more detail further below, the charged-particle detection system may preferably be operated in two different modes, a diffraction mode and an imaging mode.

In general, the charged-particle-optical system may be arranged along the optical axis downstream the charged-particle source. Likewise, the charged-particle detection system may be arranged along the optical axis downstream the sample position.

According to one aspect of the invention, the tilt axis may be substantially fixed in space. As used herein, the term "substantially fixed in space" is meant such that the orientation of the tilt axis, that is the direction of the tilt axis, is non-adjustable at least in a user mode or operation mode. This does not exclude any adjustability for an initial alignment or for maintenance and service purposes. Advantageously, having the tilt axis substantially fixed in space reduces the risk for undesired displacements of the tilt axis relative to a desired orientation. Such undesired displacements may otherwise occur in case of an adjustable tilt axis, for example, due to creeping of adjustment means for changing the orientation of the tilt axis.

For the same reason, the beam axis of the charged-particle beam may be fixed in space. That is, the direction of the beam axis may be non-adjustable. In particular, the beam axis of the charged-particle beam may be fixed relative to the tilt axis.

Alternatively, the beam axis of the charged-particle beam may be adjustable relative to the tilt axis. This enables to irradiate the sample under different angles relative to the tilt axis and, thus, under different angles relative to the crystal axes and crystal faces of the sample to be probed. Advantageously, this may help to gain further insights into the crystalline structure of the sample.

Preferably, the tilt axis extends in a substantially vertical direction. In case of a vertical orientation of the tilt axis, any gravitational effects on the tilt axis, the sample holder and the sample are the same for each tilt position. Advantageously, this facilitates to reduce gravitation-induced variations of the tilt axis orientation between different tilt angle positions. For this reason, a vertical orientation of the tilt axis may improve the positional stability of the sample holder and the sample over the entire tilt angle range. As will be described in more detail further below, a vertical orientation of the tilt axis may also prove advantageous with regard to an operation of the diffractometer at cryogenic temperatures. As to this, the vertical orientation of the tilt axis allows to attach a cryogenic cooling source to the manipulator in an upright position which in turn allows for co-rotating the cooling source around the tilt axis without causing liquefied gas contained therein to spill out.

In particular with regard to a vertical arrangement of the tilt axis, the manipulator may be arranged either vertically above or vertically below the sample holder.

In case the tilt axis extends in a substantially vertical direction, the beam axis of the charged-particle beam preferably extends in a substantially horizontal direction. In this configuration, the tilt axis and the beam axis are perpendicular to each other. Advantageously, this simplifies the design of the diffractometer.

According to another aspect of the invention, the manipulator may further comprise a single-axis translation stage for moving the sample holder along an axis substantially parallel to the tilt axis. This allows for adjusting the position of the sample and the sample holder relative to the charged-particle beam along the direction of tilt axis and, thus, to properly place the sample in the charged-particle beam.

The single-axis translation stage may be operatively coupled between the multi-axes translation stage and the rotation stage such that the single-axis translation stage is in the rotational system of the rotation stage and the multi-axes translation stage is in a moving system of the single-axis translation stage. Advantageously, this allows for combining the multi-axes translation stage and the single-axis translation stage into a (single) combined translation stage which is configured to move the sample holder along an axis substantially parallel to the tilt axis as well as in a plane substantially perpendicular to the tilt axis. Such a combined translation stage may allow for a very compact design of the manipulator.

Alternatively, the rotation stage may be operatively coupled between the multi-axes translation stage and the single-axis translation stage such that the rotation stage is in a moving system of the single-axis translation stage and the multi-axes translation stage is in the rotational system of the rotation stage. This configuration may allow for minimizing the distance between an intersection of the sample holder and the beam axis and a rotation of center of the rotation stage. This in turn may prove advantageous to minimize any lateral deviations of the tilt axis at the intersection of the sample holder and the beam axis from a predefined reference orientation.

As used herein, the term "intersection of the sample holder and the beam axis" refers to the pre-defined location of the sample when being mounted to the sample holder. The term "rotational center of the rotation stage" preferably refers to a position of a rotational actuator which is part of the rotation stage and configured to generate a rotational movement for tilting the sample holder. That is, the above mentioned distance is measured between the designated position of the sample and the position of the rotational actuator.

According to another aspect of the invention, the multi-axes translation stage may be arranged within a sample chamber of the diffractometer. The sample chamber also may be denoted as column. Like in electron microscopy, the sample chamber contains the sample holder and the sample. Preferably, the sample chamber is configured for vacuum operation. That is, the interior of the sample chamber may be evacuated or evacuatable to suppress undesired interaction of the charged-particle beam with any matter other than the sample. Having the multi-axis translation stage arranged within the sample chamber also proves advantageous with regard to a compact design of the manipulator.

According to yet another aspect of the invention, the rotation stage may be arranged outside or inside the sample chamber of the diffractometer. An arrangement outside the sample chamber improves accessibility of the rotation stage, such as for maintenance or repair work. Furthermore, such a configuration is technically less demanding. In particular, the rotation stage does not need to be vacuum compatible. An arrangement outside the sample chamber requires a mechanical shaft feedthrough into the sample chamber. In contrast, a mechanical shaft feedthrough may be dispensable in case the rotation stage is arranged inside the sample chamber.

Depending on the position of the single-axis translation stage relative to the multi-axes translation stage and the rotation stage, the single-axis translation stage—if present—may be arranged outside or inside the sample chamber of the diffractometer. Preferably, the single-axis translation stage is arranged outside the sample chamber in case the rotation stage is operatively coupled between the multi-axes translation stage and the single-axis translation stage or in case the rotation stage is arranged outside the sample chamber. In contrast, the single-axis translation stage may be arranged inside the sample chamber in case the single-axis translation stage is operatively coupled between the multi-axes stage and the rotation stage or in case the rotation stage is arranged inside the sample chamber.

According to a further aspect of the invention, a distance between an intersection of the sample holder and the beam axis and a rotational center of the rotation stage may be in a range of 10 cm to 30 cm, preferably 15 cm to 20 cm. A distance within these ranges advantageously ensures a sufficiently large positional stability of the tilt axis, in particular in case the rotation stage is arranged outside the sample chamber. Otherwise, in case the rotation stage is arranged inside the sample chamber, the distance between an intersection of the sample holder and the beam axis and a rotational center of the rotation stage may be even shorter, in particular in a range of 1 cm to 15 cm, preferably 2 cm to 10 cm.

According to a further aspect of the invention, the rotation stage may be configured to tilt the sample holder over an angular range between +70° and −70°, in particular between +250° and −70°, or between −250° and +70°, preferably between +360° and −360°. The given angular positions are measured with regard to a reference plane which contains the beam axis and which is parallel to the tilt axis. An angular range between +70° and −70°, in particular between +250° and −70° or between −250° and +70° advantageously allows for an unrestricted or mostly unrestricted irradiation of the sample without having the incident charged-particle beam to collide with the sample holder.

According to a further aspect of the invention, the diffractometer may be configured to measure a tilt series of diffraction patterns in a continuous tilting mode. In this mode, the tilt angle is continuously changed while acquiring a series of diffraction patterns. Advantageously, measuring in a continuous tilting mode significantly reduces the time for data acquisition. In particular, the continuous tilting mode does not require to wait after having changed to another tilt position until vibrations, e.g. due to rotationally acceleration, have damped out and until the position of the sample holder has stabilized. According to this aspect, the rotation stage may be configured to tilt the sample holder with a constant angular velocity in a range of 0.1°/s to 100°/s, in particular 1°/s to 30°/s, preferably 1°/s to 6°/s.

In general, the rotation stage may comprise a rotational actuator which is configured to generate the rotational movement for tilting the sample holder. Likewise, the single-axis translation stage and the multi-axes translation stage may comprise a linear actuator for each respective translation axis which is configured to generate a linear movement. The rotational actuator and or the respective linear actuators may comprise, for example, a piezo drive or a servo drive or a liner motor, respectively.

According to another aspect of the invention, the diffractometer is a cryogenic diffractometer. For this, the diffractometer may comprise a cryogenic cooling source which is in thermal contact with the sample holder via the manipulator. Advantageously, this allows recording diffraction patterns while the sample is at a cryogenic temperature, for example below −150° C. At such temperatures, the lifetime of the sample within the harsh environment of the diffractometer (high level of irradiation and/or vacuum) is much larger. In particular, the cryogenic cooling source may comprise an insulating storage vessel, for example a Dewar vessel, which is arranged and configured to hold liquefied gas, for example liquefied nitrogen.

According to yet another aspect of the invention, the diffractometer may further comprise a measurement device, in particular one or more capacitive position sensors or an interferometric measurement device, for measuring a position of the sample holder. In particular, the interferometric measurement device may comprise a mirror. The mirror preferably is attached to the tilt axis. In particular, the mirror may be arranged between the rotation stage and the multi-axes translation stage. In addition, the interferometric measurement device may comprise a coherent light source, for example a laser, a beam splitter and a light detector. With regard to the one or more capacitive position sensors, the diffractometer may comprise a capacitive position sensor for each for each axis of manipulator. This enables to measure a position of the sample holder and thus of the sample relative to the reference system of the particle beam via a chain of position measurements for the various axes of the manipulator, that is, via the chain of capacitive position sensors in the respective reference systems of the various axes of the manipulator. Preferably, the diffractometer comprises at least a capacitive position sensor for each axis of the multi-axes translation stage used for moving the sample holder in a plane perpendicular to the tilt axis. This enables to measure and control the position of the sample holder and the center of mass of the sample relative to the tilt axis and thus to keep the center of mass of the sample substantially on-axis with regard to the tilt axis.

In addition, the diffractometer may comprise a feedback controller. The feedback controller may be operatively coupled to the measurement device and the manipulator and may be configured to control the position of the sample relative to the charged-particle beam, in particular such that for each tilt angle position of the rotation stage the center of mass of the sample stays substantially on-axis with regard to the tilt axis with a maximum lateral deviation from the tilt axis of at most 1 μm, in particular of at most 0.5 μm, preferably of at most 0.3 μm, even more preferably of at most 0.1 μm and thus that for each tilt angle position of the rotation stage the volume of the sample substantially stays within the charged-particle beam. For this, the feedback controller may be operatively coupled at least to the multi-axes translation stage used for moving the sample holder in a plane perpendicular to the tilt axis and at least to a measurement device, for example one or more capacitive position sensors, for measuring the position of the sample holder and the center of mass of the sample relative to the tilt axis. Advantageously, this enables to keep the center of mass of the sample substantially on-axis with regard to the tilt axis and thus to keep the volume of the sample substantially within the charged-particle beam.

As used in the specification including the appended claims, the singular forms "a", "an", and "the" include the plural, unless the context explicitly dictates otherwise. When using the term "about" with reference to a particular numerical value or a range of values, this is to be understood in the sense that the particular numerical value referred to in connection with the "about" is included and explicitly disclosed, unless the context clearly dictates otherwise. For example, if a range of "about" numerical value A to "about" numerical value B is disclosed, this is to be understood to include and explicitly disclose a range of numerical value a to numerical value b. Also, whenever features are combined with the term "or", the term "or" is to be understood to also include "and" unless it is evident from the specification that the term "or" must be understood as being exclusive.

DESCRIPTION OF THE DRAWINGS

Further advantageous aspects of the invention become apparent from the following description of embodiments of the invention with the aid of the drawings, in which:

FIG. 1 schematically illustrates a first exemplary embodiment of a diffractometer 1 according to the present invention that is suitable for charged-particle crystallography of a crystalline sample 31. In the present embodiment, the setup of the diffractometer 1 is based on the general setup of an electron microscope, in particular of a Transmission Electron Microscope (TEM). In particular, the diffractometer 1 according to the present embodiment is an electron diffractometer using electrons as charged particles to determine the structure of the crystalline sample 31.

Figure 1:
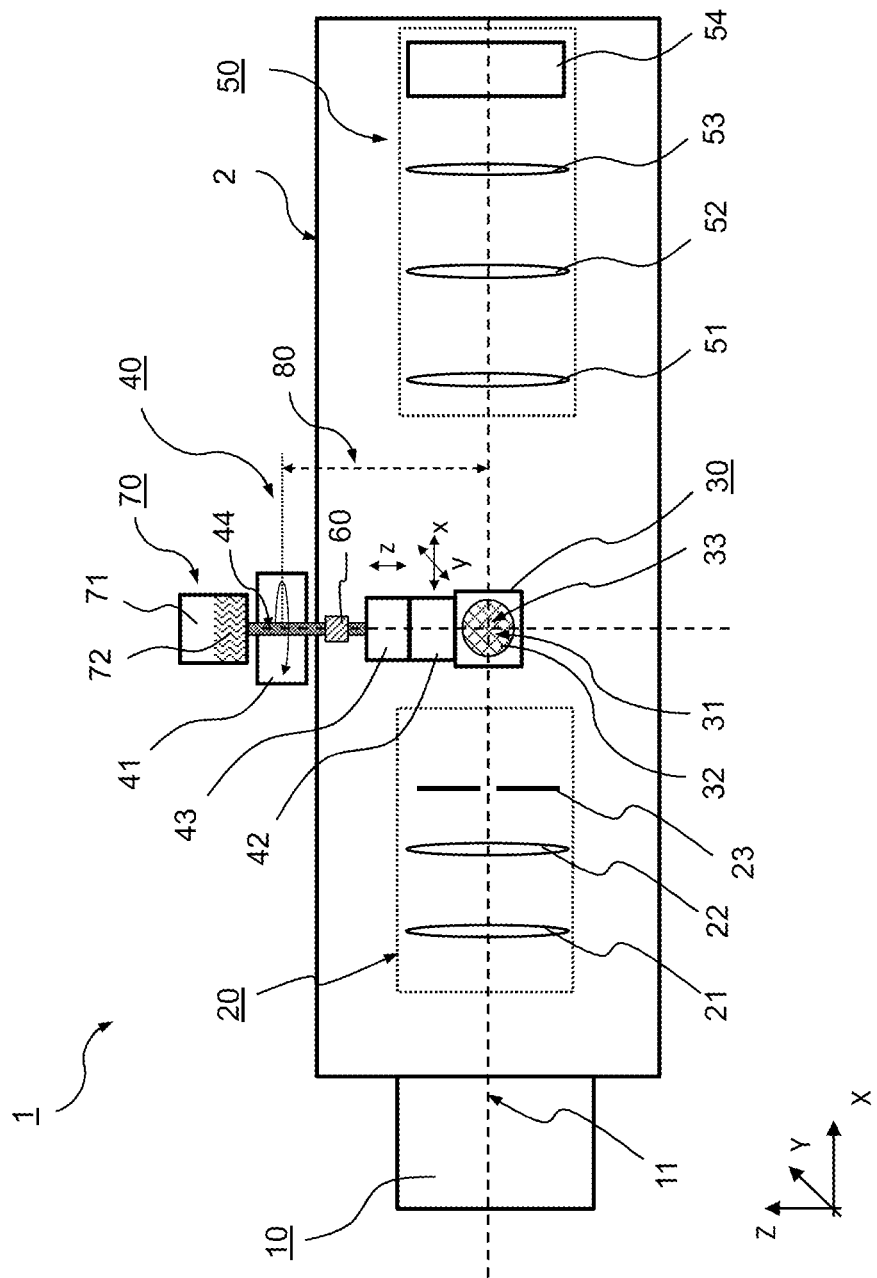
FIG. 1 schematically illustrates of a diffractometer according to a first exemplary embodiment the present invention.

As can be seen in FIG. 1, the diffractometer 1 comprises a charged-particle source 10 for generating a beam of electrons along a beam axis 11. The charged-particle source is configured to generate an electron beam of about 200 keV±1.2 keV. In contrast to the general setup of standard electron microscopes, which typically comprise a vertical arrangement having the election beam axis extending vertically downwards, the diffractometer 1 according to the present embodiment comprises a horizontal arrangement having the beam axis 11 extending along a horizontal direction X.

Downstream the charged-particle source 10, the beam of electrons is manipulated by a charged-particle-optical system 20 such as to form a parallel beam electrons impinging on the sample 31. For this, the charged-particle-optical system 20 comprises two condenser lenses 21 and 22 as well as an aperture 23, wherein the diameter of the electron beam at the sample position is governed by the diameter of the aperture 23. The charged-particle-optical system 20 may further comprise alignment coils (not shown) to center the beam of electrons on the beam axis 11. Preferably, the charged-particle-optical system 20 is configured such that the electron beam has a beam diameter of at most 1.5 µm, in particular of at most 1 µm, preferably in a range between 0.5 µm and 0.3 µm at the sample position.

The diffractometer 1 further comprises a charged-particle detection system 50 for collecting a diffraction pattern of the sample 31 based on the beam of electrons transmitted through the sample 31. The detection system 50 is arranged along the optical axis 11 downstream the sample position. In the present embodiment, the detection system 50 comprises an objective lens 51 which may form a magnified image of the sample 31. The detection system 50 further comprises a projection system including two lenses 52 and 53 which may form a magnified image of the sample on a detector 54. The detector 54 may be a fluorescent screen or an electron detector. In particular, the detector 54 may be a direct electron detector, for example as available from DETRICS Ltd. (e.g. DECTRIS QUADRO detector, number of pixels 514×514, pixel size 75 µm×75 µm, maximum frame rate, 18,000 frames/sec., energy range 30-300 keV).

In principle, the charged-particle detection system 50 may be operated in two different modes, a diffraction mode and an imaging mode. In the diffraction mode, the sample is irradiated, preferably with a parallel beam of charged particles, as a result of which a diffraction pattern is formed in the back-focal plane of the objective lens 51. The projection lenses 52 and 53 are arranged such as to form an enlarged image of the back-focal plane on the image plane of the detector 54. In the imaging mode, the sample may be irradiated in a similar manner as in the diffraction mode. However, in the this mode, the projection lenses 52 and 53 do not image the back-focal plane of the objective lens 51 on the imaging plane as in the diffraction mode, but the sample plane on the imaging plane. In the imaging mode, an image of the sample is formed by intensity radiation resulting from charged particles being absorbed in the sample and charged particles diffracted in the sample interfering with charged particles passing the sample unhindered.

For holding the sample 31, the diffractometer 1 comprises a sample holder 30. Typically, the sample 31 is mounted on a grid 32, which in turn is mounted on the sample holder 30. The grid 32 may be, for example, a copper grid, having a diameter of about 3 mm and a mesh size of 50 µm, as typically used for crystallographic probes.

The sample holder 30 and thus the sample 31 are arranged within a sample chamber 2 of the diffractometer 1. The sample chamber 2 also contains the charged-particle-optical system 20 as well as the charged-particle detection system 50. Typically, the sample chamber 2 is under vacuum conditions to suppress undesired interaction of the electron beam with any matter other than the sample 31.

The sample holder 30 is operatively coupled to a manipulator 40 for positioning the sample 31 relative to the beam axis 11. In the present embodiment, the manipulator 40 comprises a rotation stage 41 for tilting the sample holder 30 around a tilt axis 44 with respect to the incident electron beam. Tilting of the sample 31 is used to perform a procedure often denoted as electron diffraction tomography and as described, for example in EP 2 402 976 A1. Electron diffraction tomography is based on reconstructing a three-dimensional electron diffraction data set of the crystalline sample from a tilt series of diffraction patterns which are acquired by irradiating the sample at different tilt angles and by collecting the scattered and non-scattered electrons transmitted through the sample for each tilt angle.

To avoid or minimize a collision of the incident charged-particle beam with the sample holder 30, the rotation stage 41 preferably is configured to tilt the sample holder over an angular range between +70° and −70°, in particular between +250° and −70° or between −250° and +70°. The given angular ranges are measured with regard to a reference plane which contains the beam axis 11 and which is parallel to the tilt axis 44. Furthermore, the rotation stage 41 preferably is configured to tilt the sample holder 30 with a constant angular velocity in a range of 0.1°/s to 100°/s, in particular 1°/s to 30°/s. Advantageously, this allows for taking an electron diffraction tomogram in a continuous tilt mode, for example as described in Nannenga et al., Nature Methods, Vol. 11, No. 9, September 2014.

In the present embodiment, the rotation stage 41 is arranged outside the sample chamber 2 of the diffractometer 1. Advantageously, this arrangement improves the accessibility of the rotation stage 41, e.g. for maintenance or repair work. Furthermore, such a configuration is technically less demanding as, for example, the rotation stage 41 does not need to be vacuum compatible.

For positioning the sample 31 relative to the electron beam, the manipulator 40 according to the present embodiment comprises two translation stages: a multi-axes translation stage 42 for moving the sample holder 30 and thus the sample 31 at least in a plane x-y perpendicular to the tilt axis 44, as well as a single-axes translation stage 43 for moving the sample holder 30 along an axis z substantially parallel to the tilt axis 44.

As can be seen in FIG. 1, the multi-axes translation stage 42 is operatively coupled between the sample holder 30 and the rotation stage 41 such that the multi-axes translation stage 42 is in the rotational system of the rotation stage 41 and the sample holder 30 is in the moving system of the multi-axes translation stage 30. Advantageously, this configuration enables to exactly position the center of mass of the sample 31 on-axis with the tilt axis 44 such that the sample volume substantially stays within the electron beam for each tilt angle position. In particular, this configuration requires that the center of mass of the sample 31 is aligned to the tilt axis 44 only once instead of re-aligning the sample almost each time the tilt angle is changed substantially by about 5° or 10°. Preferably, the multi-axes translational stage 42 is configured such as to allow a positioning of the center of mass of the sample 31 relative to the tilt axis 44 within a maximum tolerance range of at most 1 µm, in particular of at most 0.5 µm, preferably of at most 0.3 µm, even more preferably of at most 0.1 µm, as measured in a radial direction from the tilt axis 44.

In the embodiment shown in FIG. 1, the single-axes translation stage 43 is operatively coupled between the multi-axes translation stage 42 and the rotation stage 41 such that the single-axis translation stage 43 is in the rotational system of the rotation stage 41 and the multi-axes translation stage 42 is in the moving system of the single-axis translation stage 43. This configuration allows for a very compact design of the manipulator. Alternatively, the rotation stage 41 may be operatively coupled between the multi-axes translation stage 42 and the single-axis translation stage 43 such that the rotation stage 41 is in a moving system of the single-axis translation stage 43 and the multi-axes translation stage 42 is in the rotational system of the rotation stage 41.

The position of the sample may be actively stabilized. For this, the diffractometer 1 comprises an interferometric measurement device including a mirror 60 attached to a shaft of the manipulator 40 for measuring the actual position of the sample holder 31 in an interferometric manner. The measured actual position may be fed to a feedback controller (not shown) which is operatively coupled to the manipulator and configured to control the position of the sample 31 relative to the charged-particle beam to a desired position.

To increase the lifetime of the sample 31, the diffractometer according to the present embodiment further comprises a cryogenic cooling source 70 which is in thermal contact with the sample holder 30 via the manipulator 40. The cryogenic cooling source 70 comprises a cup-like insulating storage vessel 71, for example a Dewar vessel, used to hold liquefied gas 72, for example liquefied nitrogen, to cool the sample holder 31 and the sample 30 down to cryogenic temperatures, e.g. below −150° C.

As can be further seen in FIG. 1, the manipulator 40 is arranged vertically above the sample holder 30 with the tilt axis 44 extending in a substantially vertical direction Z. Due to this, any gravitational effects on the tilt axis 44, the sample holder 30 and the sample 31 are the same for each tilt position. Advantageously, this reduces gravitation-induced variations of the tilt axis orientation between different tilt angle positions and, thus, improves the positional stability of the sample holder 30 over the entire tilt angle range. In addition, the vertical arrangement of the tilt axis 44 advantageously allows the cryogenic cooling source 70 on top of the manipulator to co-rotate with the sample holder 31 over the entire tilt angle range without causing liquefied gas 72 to spill out of the storage vessel 71 and without causing situations that allow sudden gravitational relevant impacts during operation.

Figure 2:
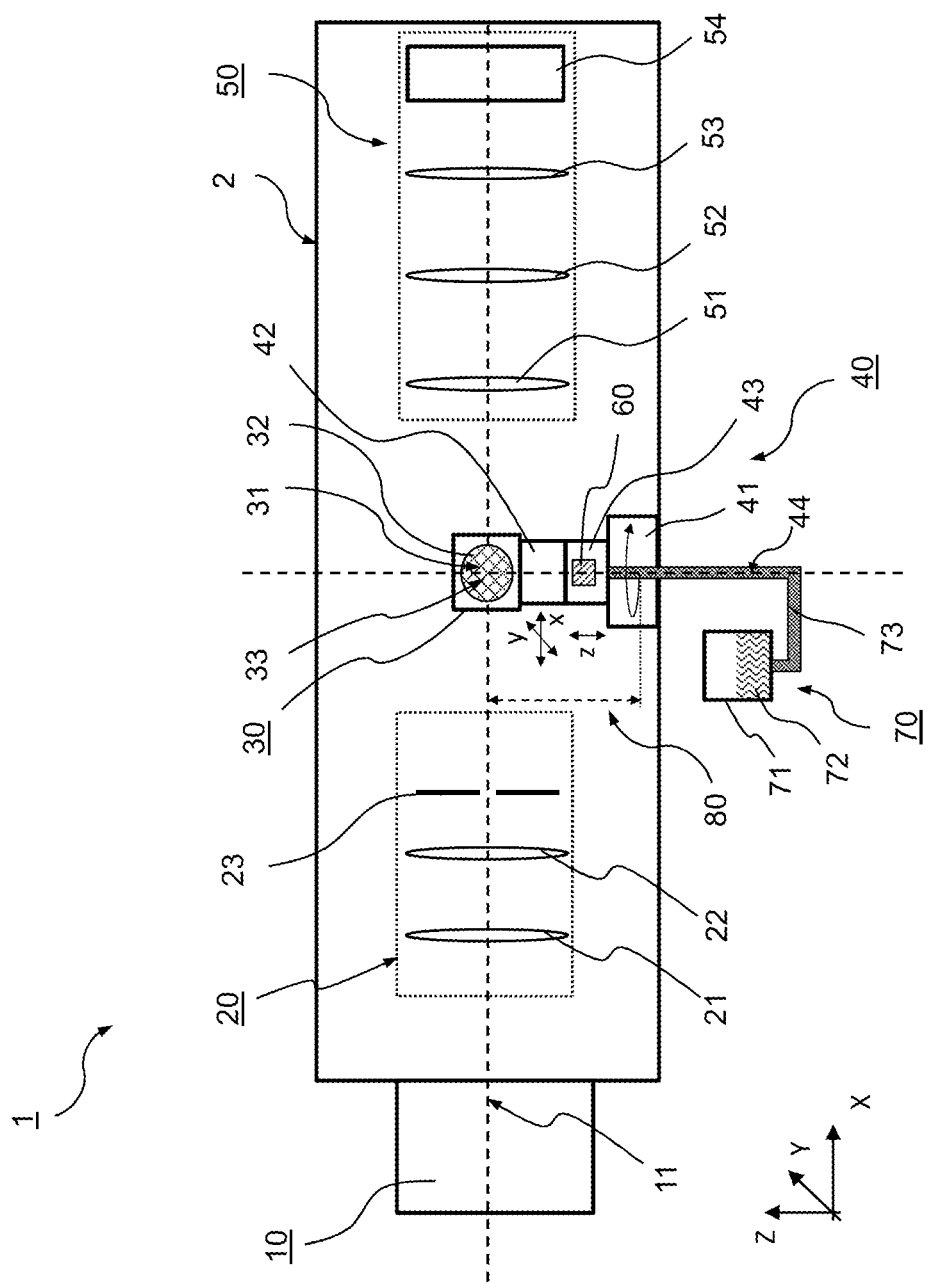
FIG. 2 schematically illustrates a diffractometer according to a second exemplary embodiment of the present invention.

FIG. 2 shows an alternative embodiment of a diffractometer 1 according to the present invention, which is similar to the diffractometer 1 according to FIG. 1. For this reason, identical or similar features are denoted with the same reference signs. In contrast to the diffractometer 1 according to FIG. 1, the manipulator 40 of the diffractometer according to FIG. 2 is arranged vertically below the sample holder 30. In addition, the rotation translation stage 41 is arranged inside the sample chamber 2. This configuration allows for an even more compact design of the manipulator 40. In particular, having the rotation translation stage 41 arranged inside the sample chamber 2 allows for reducing the distance 80 between an intersection 33 of the sample holder 30 and the beam axis 11 and a rotational center of the rotation stage 41. Advantageously, this increases the positional stability of the tilt axis 44 as compared to the diffractometer according to FIG. 1. In FIG. 1, the distance 80 is in a range of 10 cm to 30 cm, preferably 15 cm to 20 cm. In contrast, the distance 80 in FIG. 2 is in a range of 1 cm to 15 cm, preferably 2 cm to 10 cm.

As can be further seen in FIG. 2, the diffractometer at the second embodiment also comprises a cryogenic cooling source 70. Here, the cryogenic cooling source 70 is in thermal contact with the sample holder 30 and the manipulator 40 via a thermal conductive rotary arm 73. Advantageously, the rotary arm 73 allows for an upright arrangement of the storage vessel 71 without causing the liquefied gas 72 to spill out thereof.

Figure 3:
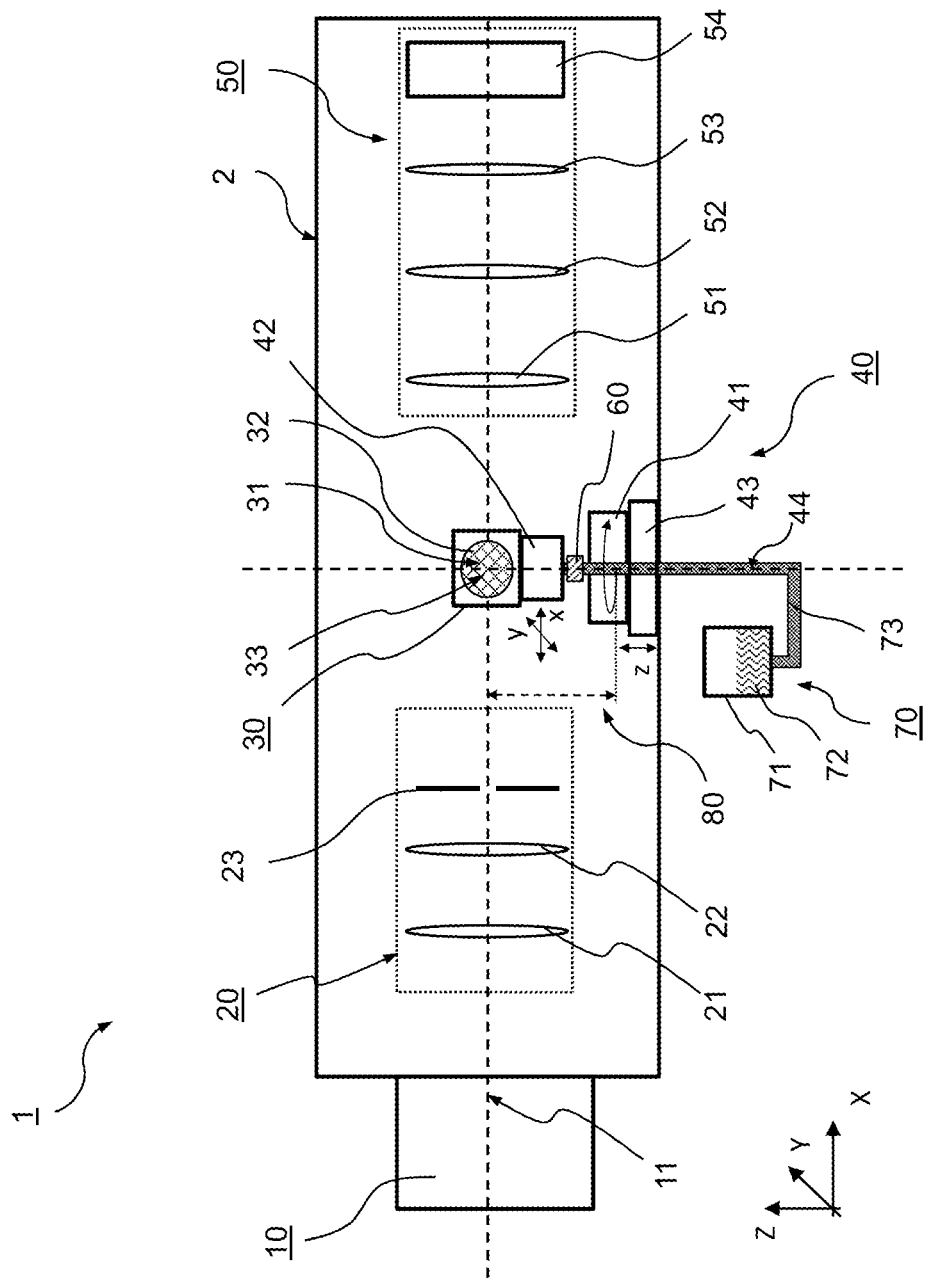
FIG. 3 schematically illustrates a diffractometer according to a third exemplary embodiment of the present invention.

FIG. 3 shows another alternative embodiment of a diffractometer 1 according to the present invention, which is similar to the diffractometer 1 according to FIG. 2. For this reason, identical or similar features again are denoted with the same reference signs. In contrast to the diffractometer 1 according to FIG. 2, the rotation stage 41 of the diffractometer 1 according to FIG. 3 is operatively coupled between the multi-axes translation stage 42 and the single-axis translation stage 43 such that the rotation stage 41 is in a moving system of the single-axis translation stage 43 and the multi-axes translation stage 42 is in the rotational system of the rotation stage 41. As in FIG. 2, the rotation stage 41 is inside the sample chamber 2. Alternatively, the rotation stage 41 may be arranged outside the sample chamber 2.

The invention claimed is:

1. A diffractometer for charged-particle crystallography of a crystalline sample, in particular for electron crystallography of a crystalline sample, the diffractometer comprising:
   a charged-particle source for generating a charged-particle beam along a charged-particle beam axis,
   a charged-particle-optical system for manipulating the charged-particle beam such as to irradiate the sample with the charged-particle beam;
   a sample holder for holding the sample,
   a manipulator operatively coupled to the sample holder for positioning the sample relative to the beam axis, wherein the manipulator comprises a rotation stage for tilting the sample holder with respect to the incident charged-particle beam around a tilt axis, and a multi-axes translation stage for moving the sample holder at least in a plane perpendicular to the tilt axis, wherein the multi-axes translation stage is operatively coupled between the sample holder and the rotation stage such that the multi-axes translation stage is in a rotational system of the rotation stage and the sample holder is in a moving system of the multi-axes translation stage, thereby enabling to position the center of mass of the sample substantially on-axis with regard to the tilt axis with a maximum lateral deviation from the tilt axis of at most 1 μm,
   a charged-particle detection system at least for collecting a diffraction pattern of the sample based on the beam of charged-particles transmitted through the sample,
   wherein the tilt axis is fixed in space and extends in a substantially vertical direction,
   wherein the diffractometer further comprises a measurement device including an interferometric measurement device for measuring a position of the sample holder relative to the charged-particle beam, wherein the interferometric measurement device includes a mirror attached to the tilt axis, and
   wherein the diffractometer further comprises a feedback controller which is operatively coupled to the measurement device and the manipulator and configured to control the position of the sample relative to the charged-particle beam such that for each tilt angle position of the rotation stage the center of mass of the sample stays substantially on-axis with regard to the tilt axis with a maximum lateral deviation from a predefined reference of the tilt axis of at most 1 μm, and thus that for each tilt angle position of the rotation stage the volume of the sample substantially stays within the charged-particle beam.

2. The diffractometer according to claim 1, wherein the beam axis is fixed in space, in particular extends in a substantially horizontal direction, or wherein the orientation of the beam axis is adjustable relative to the tilt axis.

3. The diffractometer according to claim 1, wherein the manipulator further comprises a single-axis translation stage for moving the sample holder along an axis substantially parallel to the tilt axis.

4. The diffractometer according to claim 3, wherein the single-axis translation stage is operatively coupled between the multi-axes translation stage and the rotation stage such that the single-axis translation stage is in the rotational system of the rotation stage and the multi-axes translation stage is in a moving system of the single-axis translation stage.

5. The diffractometer according to claim 3, wherein the rotation stage is operatively coupled between the multi-axes translation stage and the single-axis translation stage such that the rotation stage is in a moving system of the single-axis translation stage and the multi-axes translation stage is in the rotational system of the rotation stage.

6. The diffractometer according to claim 1, wherein the multi-axes translation stage is arranged within a sample chamber of the diffractometer.

7. The diffractometer according to claim 6, wherein the rotation stage is arranged outside or inside the sample chamber of the diffractometer.

8. The diffractometer according to claim 6, wherein the manipulator further comprises a single-axis translation stage for moving the sample holder along an axis substantially parallel to the tilt axis, wherein the single-axis translation stage is arranged outside or inside the sample chamber of the diffractometer.

9. The diffractometer according to claim 1, wherein the diffractometer is a cryogenic diffractometer comprising a cryogenic cooling source which is in thermal contact with the sample holder via the manipulator.

10. The diffractometer according to claim 1, wherein the rotation stage is configured to tilt the sample holder over an angular range between +70° and −70° with regard to a reference plane which contains the beam axis and is parallel to the tilt axis.

11. The diffractometer according to claim 1, wherein the rotation stage is configured to tilt the sample holder with a constant angular velocity in a range of 0.1°/s to 100°/s.

12. The diffractometer according to claim 1, wherein a distance between an intersection of the sample holder and the beam axis and a rotational center of the rotation stage is in a range of 10 cm to 30 cm.

13. The diffractometer according to claim 1, wherein the charged-particle-optical system is configured to manipulate the charged-particle beam such the charged-particle beam irradiated to the sample is a parallel beam of charged-particles having a beam diameter of at most 1.5 µm.

14. The diffractometer according to claim 1, wherein the feedback controller is configured to control the position of the sample relative to the charged-particle beam such that for each tilt angle position of the rotation stage the center of mass of the sample stays substantially on-axis with regard to the tilt axis with a maximum lateral deviation from the tilt axis of at most 0.5 µm.

15. The diffractometer according to claim 1, wherein the feedback controller is configured to control the position of the sample relative to the charged-particle beam such that for each tilt angle position of the rotation stage the center of mass of the sample stays substantially on-axis with regard to the tilt axis with a maximum lateral deviation from the tilt axis of at most 0.3 µm.

16. The diffractometer according to claim 1, wherein the feedback controller is configured to control the position of the sample relative to the charged-particle beam such that for each tilt angle position of the rotation stage the center of mass of the sample stays substantially on-axis with regard to the tilt axis with a maximum lateral deviation from the tilt axis of at most 0.1 µm.

17. The diffractometer according to claim 1, wherein the rotation stage is configured to tilt the sample holder over an angular range between +250° and −70° or between −250° and +70° with regard to a reference plane which contains the beam axis and is parallel to the tilt axis.

18. The diffractometer according to claim 1, wherein the rotation stage is configured to tilt the sample holder over an angular range between +250° and −70° or between −360° and +360° with regard to a reference plane which contains the beam axis and is parallel to the tilt axis.

19. The diffractometer according to claim 1, wherein the rotation stage is configured to tilt the sample holder with a constant angular velocity in a range of 1°/s to 30°/s.

20. The diffractometer according to claim 1, wherein a distance between an intersection of the sample holder and the beam axis and a rotational center of the rotation stage is in a range of 15 cm to 20 cm, or in a range of 2 cm to 10 cm.

21. The diffractometer according to claim 1, wherein the charged-particle-optical system is configured to manipulate the charged-particle beam such the charged-particle beam irradiated to the sample is a parallel beam of charged-particles having a beam diameter of at most 1 µm.

22. The diffractometer according to claim 1, wherein the charged-particle-optical system is configured to manipulate the charged-particle beam such the charged-particle beam irradiated to the sample is a parallel beam of charged-particles having a beam diameter in a range between 0.5 µm and 0.3 µm.

* * * * *